Figure 2:
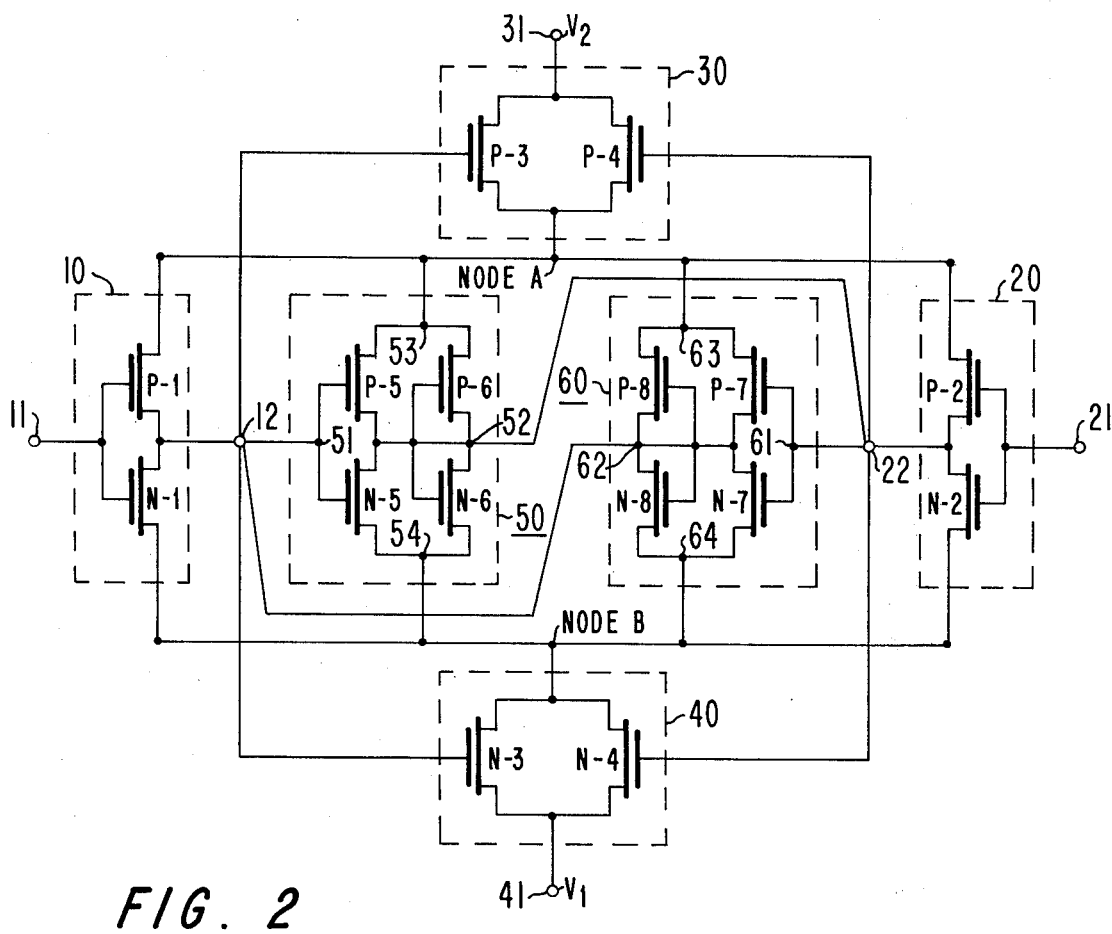

United States Patent [19]
Pryor

[11] 3,991,380
[45] Nov. 9, 1976

[54] COMPLEMENTARY FIELD EFFECT TRANSISTOR DIFFERENTIAL AMPLIFIER

[75] Inventor: Richard Lee Pryor, Voorhees, N.J.

[73] Assignee: RCA Corporation, New York, N.Y.

[22] Filed: Feb. 9, 1976

[21] Appl. No.: 656,296

[52] U.S. Cl. .................................... 330/13; 330/18; 330/19; 330/22; 330/28; 330/30 D; 330/35
[51] Int. Cl.$^2$ ............................................ H03F 3/18
[58] Field of Search .................. 330/13, 18, 17, 15, 330/19, 22, 28, 30 D, 35, 38 M; 307/304

[56] References Cited
UNITED STATES PATENTS
3,870,966   3/1975   Dingwall ........................... 330/35 X

*Primary Examiner*—James B. Mullins
*Attorney, Agent, or Firm*—H. Christoffersen; S. Cohen; R. G. Coalter

[57] ABSTRACT

A feedback circuit responsive to the output signals of two amplifiers provides feedback in a sense to amplify differential mode components and reject common mode components of input signals supplied to the amplifiers, the resultant common mode rejection ratio (CMRR) being substantially independent of the magnitude of the common mode voltage. A further feedback circuit provides feedback of a sense to increase the CMRR when the magnitude of the common mode voltage differs in either sense from a given value whereby the net CMRR increases from a minimum value as the common mode voltage varies in either sense from the given value.

7 Claims, 3 Drawing Figures

COMPLEMENTARY FIELD EFFECT TRANSISTOR DIFFERENTIAL AMPLIFIER

This invention relates to amplifiers and particularly to improvements in complementary field effect transistor differential amplifiers for increasing the common-mode rejection ratio (CMRR) thereof.

Complementary field effect transistor differential amplifiers are known which include two input terminals for receiving input signals having a common mode voltage component, $V_{cm}$, two output terminals for producing output signals and two internal nodes at different voltage levels wherein the node voltages each change in the same sense for a given change in $V_{cm}$. Such amplifiers are described in more detail in the subsequent discussion of FIG. 1.

In accordance with one aspect of this invention, the CMRR of such differential amplifiers may be improved by cross coupling two inverting amplifiers between the output terminals, each amplifier having a first supply voltage terminal connected to one of the nodes and a second supply voltage terminal connected to the other node, the gain product of the amplifiers being not more than unity.

Figure 1:
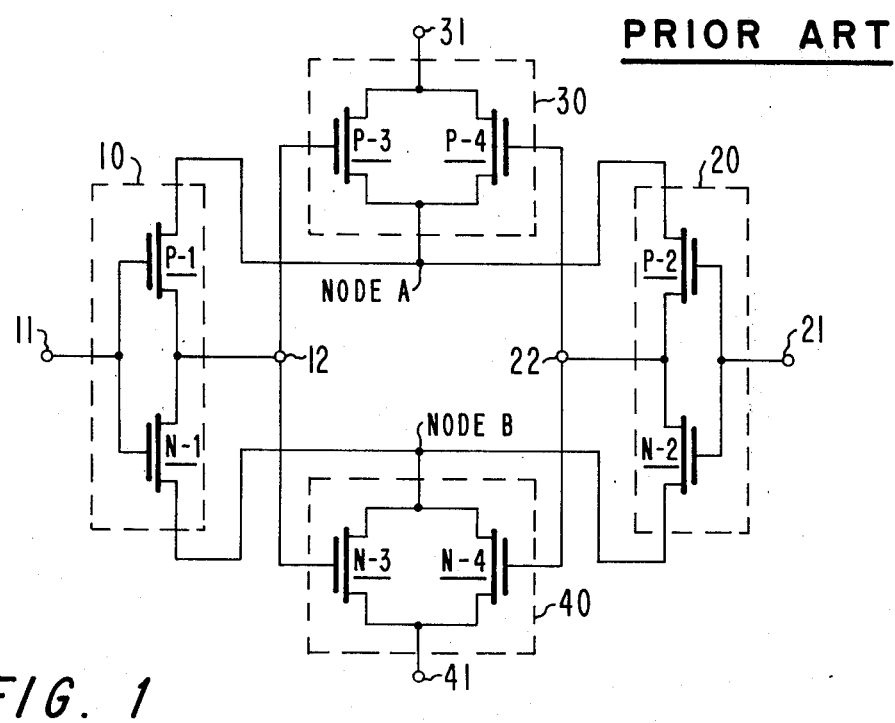

In the drawings:

FIG. 1 is a schematic diagram of a prior art complementary field effect transistor amplifier; and FIG. 2 is a schematic diagram of an amplifier embodying the invention.

Complementary field effect transistor differential amplifiers are disclosed, for example, in U.S. Pat. No. 3,870,966 entitled "complementary Field Effect Transistor Differential Amplifier" which issued 11 Mar. 1975 to A. G. F. Dingwall. FIG. 3 of that patent has been redrawn as FIG. 1 herein labelled "Prior Art." In the patented circuit, a common set of operating potentials is supplied to a pair of amplifiers. A variable impedance circuit, responsive to output signals produced by both of the amplifiers, varies the set of operating potentials in a sense to cause amplification of the differential components and rejection of the common component of input signals supplied to the amplifiers. As explained in the patent and discussed below, the CMRR of the prior art amplifier is substantially independent of the magnitude of the common mode input voltage. The present invention is directed to an improvement for increasing the CMRR of the prior art amplifier and particularly to increasing the CMRR as the magnitude of the common mode input voltage deviates in either sense from a given value.

In the prior art circuit (FIG. 1 hereof) transistors designated by letter P are P-channel enhancement mode field effect transistors and those designated by letter N are N-channel enhancement mode field effect transistors. Amplifier 10 comprises a pair of complementary field effect transistors P-1 and N-1 connected at the gate electrodes thereof to input terminal 11, at the drain electrodes thereof to output terminal 12, and at the source electrodes thereof, respectively, to nodes A and B. Amplifier 20 comprises another pair of complementary field effect transistors P-2 and N-2 connected at the gate electrodes thereof to input terminal 21, at the drain electrodes thereof to output terminal 22 and at the source electrodes thereof, respectively, to nodes A and B.

Amplifiers 10 and 20 receive a common set of operating potentials at nodes A and B which are controlled by a feedback circuit comprising a pair of controllable impedance circuits 30 and 40. Circuit 30 comprises a pair of P-channel transistors P-3 and P-4 the conduction paths of which are connected in parallel between supply terminal 31 and node A. Circuit 40 comprises a pair of N-channel transistors N-3 and N-4 the conduction paths of which are connected in parallel between supply terminal 41 and node B. The gate electrodes of transistors P-3 and N-3 are connected to output terminal 12 and those of transistors P-4 and N-4 are connected to output terminal 22.

Each of the amplifiers (10 and 20) receives a common set of operating voltages (at nodes A and B) which are controlled by the outputs of both amplifiers via variable impedance circuits 30 and 40. Each amplifier output signal therefore is a function of three variables: (1) its input signal, (2) its output signal and (3) the output signal produced by the other amplifier. This relatively complex interactive relationship, insofar as it is pertinent to an understanding of the improved differential amplifier of this invention, will now be explained in detail for common mode input signals and, subsequently, for differential mode input signals (balanced and unbalanced).

In the following discussion of the circuit common-mode response, assume that supply terminal 41 is maintained at a fixed voltage such as ground and that supply terminal 31 is maintained at a fixed positive potential. Assume initially that input terminals 11 and 21 each receive input signals which include a common mode voltage equal to half of the voltage applied to supply terminal 31 (i.e., the average of the voltage of terminals 31 and 41). Assume also that amplifiers 10 and 20 have substantially similar transfer functions (i.e., similar input/output voltage relationships).

Under these conditions, amplifiers 10 and 20 will each produce a similar output voltage, $V_o$, at their respective output terminals 12 and 22. This output voltage will lie within the limits of the node A and B voltages and represents a bias voltage common to the control electrodes (gates) of transistors P-3, P-4, N-3 and N-4. The resistance of the conduction paths of transistors P-3 and P-4 will tend to increase for increasing values of $V_o$ thus raising the impedance between supply terminal 31 and node A thereby decreasing the node A voltage. Simultaneously, for an increase in $V_o$, the resistance of the conduction paths of transistors N-3 and N-4 will tend to decrease thereby lowering the impedance between supply terminal 41 and node B and thus decreasing the node B voltage. The effect is that for increasing values of $V_o$, the impedance of the variable impedance circuits 30 and 40 vary in a complementary fashion to change the values of the node A and node B voltages in the same sense - both becoming relatively lower. Conversely, for decreasing values of $V_o$, variable impedance circuits 30 and 40 adjust their respective impedance to change the value of the node A and node B voltages to relatively more positive values.

Since the output voltage, $V_o$, produced by each amplifier is inversely related to the common mode input voltage, $V_{cm}$, it follows that the effect of the variable impedance circuits (considering only $V_{cm}$) is to change the values of the operating potentials supplied to amplifiers 10 and 20 in the same sense as the common mode input voltage. This change in operating potentials reduces the change in the output voltage for a given change in the common mode input voltage. The resultant common-mode rejection ratio is substantially independent of the magnitude of the common mode voltage over a wide range of values thereof. The magnitude of the CMRR may be increased by increasing the effective transconductances of the variable impedance circuits. Ideally, those transconductances would be as high as practical to minimize the common mode voltage gain in order to obtain higher common mode rejection ratios.

Assume now that input terminals 11 and 21 receive input signals $V_{cm}+S_1$ and $V_{cm}+S_2$, respectively, where $S_1$ and $S_2$ represent balanced differential signals (i.e., of equal magnitudes and opposite phase). Under these conditions, amplifiers 10 and 20 are biased to a quiescent operating condition in response to $V_{cm}$ as previously described. To a first approximation (under small signal conditions) the amplifiers 10 and 20 supply voltages (i.e., those at nodes A and B) will remain relatively unaffected by the presence of the differential signals. The reason for this is that as signal $S_1$ increases, the potential at output terminal 12 decreases which decreases the resistance of the conduction path of transistor P-3 and increases that of transistor N-3. Simultaneously, signal $S_2$ decreases causing an increase in the voltage at output terminal 22. Assuming that amplifiers 10 and 20 have substantially similar transfer functions, the voltage at terminal 22 will increase by an increment equal to the decrease in voltage at terminal 12. This signal causes the resistance of the conduction path of transistor P-4 to increase and that of transistor N-4 to decrease.

Under small signal conditions, the decreased resistance of transistor P-3 will be substantially offset by the increased resistance of transistor P-4 so that the parallel equivalent resistance between supply terminal 31 and node A will tend to remain constant (as far as the differential mode components are concerned). Similarly, the increased resistance of transistor N-3 will be substantially offset by the decreased resistance of transistor N-4 so that the parallel equivalent resistance between node B and supply terminal 41 will also remain substantially constant. Accordingly, the operating potentials supplied to amplifiers 10 and 20 are substantially unaffected by the balanced differential mode input signals.

Assume now that input terminals 11 and 21 receive unbalanced signals $V_{cm}+S_1$ and $V_{cm}$, respectively. The unbalanced differential mode component, $S_1$, at terminal 11 will produce an increment of decreased voltage at terminal 12 which will cause the resistance of transistor P-3 to decrease and that of transistor N-3 to increase. These changes will tend to increase the voltages at nodes A and B and thus the output voltage at terminal 22 will increase also since the terminal 21 voltage is assumed to remain constant at $V_{cm}$. Thus, differentially related output signals are produced in response to a single input signal which is particularly useful, for example, where it is desired to drive a balanced transmission line from an unbalanced source.

The improved differential amplifier of FIG. 2 includes two additional amplifiers, 50 and 60, which form a further feedback circuit for increasing the value of the CMRR when the common mode voltage varies in either sense from a given value. Amplifiers 50 and 60 are cross coupled (i.e., connected in inverse parallel) between output terminals 12 and 22 of amplifiers 10 and 20, respectively, with each of the amplifiers receiving the same common set of operating voltages from nodes A and B. The addition of amplifiers 50 and 60 in this manner results in a conditionally stable feedback loop. The necessary condition for stability, discussed in more detail subsequently, is that the product of the gains of amplifiers 50 and 60 be not greater than unity, preferably, the gain of each of those amplifiers should be not more than unity.

Amplifier 60 includes input 61, output 62 and supply terminals 63 and 64 connected, respectively, to output terminal 22, output terminal 12, node A and node B. Input 61 is connected to the gates of transistors P-7 and N-7. Output 62 is connected to the gates of transistors P-8 and N-8 and also to the drains of transistors P-7, N-7, P-8 and N-8. Supply terminal 63 is connected to the sources of transistors P-7 and P-8 and supply terminal 64 is connected to the sources of transistors N-7 and N-8.

Amplifier 50 includes input 51, output 52 and supply terminals 53 and 54 connected, respectively, to output terminal 12 of amplifier 10, output terminal 22 of amplifier 20, node A and node B. Input 51 is connected to the gates of transistors P-5 and N-5. Output 52 is connected to the gates of transistors P-6 and N-6 and also to the drains of transistors P-5, N-5, P-6 and N-6. Supply terminal 53 is connected to the sources of transistors P-5 and P-6 and supply terminal 54 is connected to the sources of transistors N-5 and N-6.

Amplifiers 50 and 60 are complementary field effect transistor amplifiers of the kind described in the United States patent application of Sheng Teng Hsu, Ser. No. 517,239, and now U.S. Pat. No. 3,946,327, which was filed on 23 Oct. 1974 and is entitled "Amplifier Employing Complementary Field Effect Transistors" (hereafter, the Hsu amplifier). While other suitable amplifiers could be employed as amplifiers 50 and 60 in the differential amplifier of FIG. 2, the Hsu amplifier has been found to offer several advantages in this application over other possible amplifiers. For example, the symmetrical structure of the Hsu amplifier preserves the overall symmetry of the differential amplifier, thereby providing the advantage of simplified circuit layout which is of particular benefit when the differential amplifier is fabricated as an integrated circuit. Also, this form of amplifier can provide uniform output characteristics (i.e., equal source and sink drive capability) and additionally, is characterized by a gain which is very stable and easily determined in accordance with processing parameters and geometric ratios of the various transistors. These and other advantages of the use of this particular form of amplifier as amplifier 50 and 60 in this invention will become more apparent from the following detailed description of circuit operation.

In operation, supply voltages $V_1$ and $V_2$ are applied to terminals 41 and 31, respectively, $V_2$ being the more positive. For purposes of discussion, assume that terminal 41 is connected to a reference point such as ground so that $V_1$ is zero and that input terminals 11 and 21 each receive a common mode input signal $V_{cm}$. For the moment, assume that $V_{cm}$ is equal to the average of $V_1$ and $V_2$, namely, $V_2/2$. Under these conditions, and assuming further that amplifiers 10, 20, 30 and 40 have reasonably symmetrical transfer characteristics, the voltages at output terminals 12 and 22 will equal the common mode voltage $V_2/2$ and amplifiers 50 and 60 will, therefore, neither supply current to nor withdraw current from terminals 12 and 22.

If now $V_{cm}$ increases by some increment, the voltages at terminals 12 and 22 will tend to decrease. This decrease is counteracted by the combined effects of variable impedance circuits 30 and 40 and amplifiers 50 and 60 as follows. The decreased voltages at terminals 12 and 22 causes the gate-to-source voltages of transistors N-3 and N-4 to be less than the gate-to-source voltages of transistors P-3 and P-4. Accordingly, the parallel equivalent resistance of transistors N-3 and N-4 becomes greater than that of transistors P-3 and P-4 so that the voltages at nodes A and B both increase. This increase is in the same sense as the assumed common mode input voltage change but is in the opposite sense as the common mode output voltage change. The internal effects of this increase, therefore, on amplifiers 10 and 20 which receive the common mode input voltage are different from the internal effects on amplifiers 50 and 60 which receive the common mode output voltage.

In more detail, since the nodal voltages (at A and B) change in the same sense as the common mode input voltage (at 11 and 21), the effect on amplifiers 10 and 20 is to tend to equalize the gate-to-source voltages (and thus the drain to source resistances) of transistors P-1 and N-1 in amplifier 10 and transistors P-2 and N-2 in amplifier 20. This tends to increase the voltages of output terminals 12 and 22 i.e., to return those terminals toward their initial voltage levels thereby counteracting the effect of the assumed increased common mode input voltage.

For amplifiers 50 and 60, however, the increase in the node A and B voltages is opposite to the change in the input voltages which they receive (i.e., the common mode output voltage). As a result, under these conditions, the gate-to-source voltages (and thus the source-to-drain conductances) of transistors P-5 and P-7 become greater than those of transistors N-5 and N-7, respectively. In amplifier 50, the increased conductance of transistor P-5 results in more current being applied to terminal 52 from node A than is withdrawn therefrom by transistor N-5, the remainder of this current being supplied from terminal 52 to output terminal 22. Amplifier 60, for the similar reasons, supplies an output current from node A through transistor P-7 to output terminal 12. The currents thus supplied to output terminals 12 and 22 tend to return those output terminals to their initial voltages ($V_2/2$) thus further counteracting the effect of the assumed increase in common mode voltage above the initial value.

Conversely, when it is assumed that the common mode voltage is less than $V_2/2$, the common mode output voltages (at terminals 12 and 22) tend to increase above $V_2/2$. Variable impedance circuits 30 and 40, in response to the increased output voltages, decrease the node A and B voltages. This causes amplifiers 10 and 20 to reduce the current they supply to the output terminals and causes amplifiers 50 and 60 to withdraw current from the output terminals to node B. As in the previous case, the overall effect is to return the output terminals to their previous voltage levels thereby counteracting the effect of the common mode voltage.

Transistors P-6 and N-6 in amplifier 50 and transistors P-8 and N-8 in amplifier 60 serve to limit the transconductance or gain of their respective amplifiers to a value not greater than unity for stability purposes. Further details concerning those transistors in amplifiers 50 and 60 will be given subsequently. At this point, however, it is sufficient to note that some suitable means (transistors or otherwise) should be included in amplifiers 50 and 60 to limit the gain in the regenerative loop which is formed by the cross coupling of amplifiers 50 and 60 to avoid the possibility of "latching" (i.e., bistable operation) of those amplifiers.

Summarizing, insofar as common mode input signals are concerned, amplifiers 50 and 60 cooperate with amplifiers 10 and 20 to provide which might loosely be termed "push-pull" common mode rejection. When, for example, the common mode input voltage is high (i.e., greater than $V_2/2$ under the given assumptions) the feedback via nodes A and B causes amplifiers 10 and 20 to withdraw less current from the output terminals than they would in the absence of the feedback. Simultaneously the feedback causes amplifiers 50 and 60 to supply additional current to the output terminals from node A. The net effect, then, is that two amplifiers are "pushing" and two amplifiers are "pulling" the output terminals back to their initial voltages. The same "push-pull" effect results when the common node input voltage is lower than the average of $V_1$ and $V_2$ (again, $V_2/2$ under the given assumptions). The feedback (i.e., the decreased node A and B voltages) causes amplifiers 10 and 20 to supply less current to the output terminals than they would in the absence of the feedback and causes amplifiers 50 and 60 to withdraw current from each output terminal via node B. This "push-pull" operation, in addition to increasing the CMRR when the common mode voltage varies in either sense from the average of $V_1$ and $V_2$, also extends the common mode input voltage range of the differential amplifier as will now be described in detail.

It is a significant feature of the invention that useful operation may be obtained even in the extreme case of common mode input voltages equal to or even greater than the supply voltages. Such operation is not possible in the prior art amplifier because in such a case no direct current path exists between terminals 31 and 41. Consider, for example, what would happen in the prior art amplifier if $V_{cm}$ were equal to $V_2$ (the voltage at terminal 31). In that case transistors P-1 and P-2, being P-channel enhancement mode devices, would be turned completely off and thus be essentially an open circuit. Whether connected to no load, a resistive load to ground or a capacitive load, output terminals 12 and 22 could not, therefore, produce output signals in response to differential input signal components accompanying such a large common mode component.

Useful results are obtained in the circuit of FIG. 2 even under such extreme conditions, since, even though transistors P-1 and P-2 are completely turned off, amplifiers 50 and 60 provide current paths from node A to the drains of transistors N-1 and N-2. The currents thus provided allow continued operation of transistors N-1 and N-2 as the common mode voltage (or any accompanying differential mode voltage) varies.

The differential mode gain in such an extreme case will decrease substantially and, in fact, a loss in differential gain may even occur. Nevertheless, differential signals accompanying such a large common mode voltage will pass through the amplifier and a substantial portion of the common mode voltage will be removed. Thus, it is possible to cascade two of the FIG. 2 amplifiers and amplify signals having common mode voltages equal to or even greater than the supply voltages. A signal loss may occur in the first amplifier but the removal of much of the common mode voltage by the first amplifier allows the second amplifier to overcome the loss and provide a gain.

Under normal operating conditions (i.e., with common mode voltages insufficient to completely turn off one of the transistors in amplifiers 10 and 20) the differential mode gain is principally determined by amplifiers 10 and 20 as in the prior art. Amplifiers 60 and 50, in a sense, supplement or reinforce the output signals of amplifiers 10 and 20 insofar as differential signals are concerned. The additional output current drive capability thus provided may be of particular advantage where the differential amplifier of FIG. 2 is employed to drive relatively low impedance loads.

As previously mentioned, it is important that the product of the gains of amplifiers 50 and 60 be not greater than unity. The gain of amplifier 50 may be made equal to unity by selecting the transconductance of the "driver" pair of transistors (P-5, N-5) to be equal to that of the "load" pair (P-6, N-6). Similarly, the gain of amplifier 60 may be made equal to unity by selecting equal transconductances for the driver (P-7, N-7), and load (P-8, N-8) transistors. In an integrated circuit, this may be done by making the channel width of a given conductivity type load transistor equal to the channel width of the corresponding conductivity type driver transistor in each amplifier.

It is acceptable that the loop gain of amplifiers 50 and 60 be less than unity. This may be achieved by making the transconductance of the "load" pair of transistors greater than that of the "driver" pair in each amplifier. In an integrated circuit this may be done by appropriate scaling of the channel widths of each corresponding conductivity type load and driver transistor in each amplifier. Assuming equal channel lengths, for example, the width of transistor P-6 may be made greater than that of transistor P-5 and similarly for transistors N-6 and N-5, transistors P-8 and P-7 and transistors N-8 and N-7.

It is a further feature of the differential amplifier of FIG. 2 that, even though the total number of transistors is twice that of the prior art amplifier (16 as compared to 8), the total number of circuit nodes (8) is unchanged and the circuit symmetry is preserved. This is of particular advantage when the amplifier is constructed as an integrated circuit since the improvement may be made to the amplifier without the troublesome complications which arise with increased numbers of nodes as asymmetrical structures.

What is claimed is:

1. In a complementary field effect transistor differential amplifier of the kind having two input terminals for receiving input signals, each signal including a common mode voltage component, $V_{cm}$, two output terminals for providing output signals and two internal nodes at different voltages, said node voltages each changing in the same sense for a given change in $V_{cm}$, the improvement, comprising:
a pair of inverting amplifiers having the input and output terminals thereof cross-coupled between said two output terminals, each inverting amplifier receiving operating voltages from said nodes, each amplifier having a gain, the product of said gains being not greater than unity, said inverting amplifiers for supplying current to both of said two output terminals from one of said nodes when $V_{cm}$ is greater than a given value and for withdrawing current from both of said two output terminals via the other of said nodes when $V_{cm}$ is less than said given value.

2. The improved differential amplifier recited in claim 1 wherein said part of inverting amplifiers comprise first and second complementary field effect transistor amplifiers, each having a first operating voltage terminal connected to said first node, a second operating voltage terminal connected to said second node, the input terminal of said first amplifier and the output terminal of said second amplifier being connected to one of said two output terminals of said differential amplifier, the input terminal of the second amplifier and the output terminal of the first amplifier being connected to the other of said two output terminals of said differential amplifier and wherein the gain of each of said first and second amplifiers is not greater than unity.

3. The improved differential amplifier recited in claim 2 wherein each of said first and second amplifiers comprises:
a first pair of field effect transistors of a first conductivity type, each having a conduction path and a control electrode, the conduction paths of each being connected in parallel between said first operating voltage terminal and the amplifier output terminal; and
a second pair of field effect transistors of a second conductivity type, each having a conduction path and a control electrode, the conduction paths of each being connected between the second node and the amplifier output terminal; the control electrode of one transistor of each pair being connected to the amplifier input terminal and the control electrode of the other transistor of each pair being connected to the amplifier output terminal.

4. In a differential amplifier of the kind comprising first and second nodes; first and second complementary field effect transistor amplifiers, each amplifier having a first operating voltage terminal connected to said first node, a second operating voltage terminal connected to said second node, an input terminal and an output terminal; a first variable impedance circuit coupled between said first node and a first reference voltage terminal; a second variable impedance circuit coupled between said second node and a second reference voltage terminal; and means coupling each output terminal to a separate control terminal of each variable impedance circuit, the improvement, comprising:
a pair of inverting amplifiers cross-coupled between said output terminals of said first and second amplifiers, each inverting amplifier receiving operating voltages from said nodes, said pair of inverting amplifiers having a gain product not greater than unity.

5. The improved differential amplifier recited in claim 4 wherein said pair of inverting amplifiers comprise:
third and fourth complementary field effect transistor amplifiers, each having a first operating voltage terminal connected to said first node, a second operating voltage terminal connected to said second node, an input terminal and an output terminal, the input terminal of the third amplifier being connected to the output terminals of the first and fourth amplifiers, the input terminal of the fourth amplifier being connected to the output terminals of the second and third amplifiers, and wherein the gain of each of the third and fourth amplifiers is not greater than unity.

6. The improved differential amplifier recited in claim 5 wherein each of said third and fourth complementary field effect transistor amplifiers comprises:
- a first pair of field effect transistors of a first conductivity type, each having a conduction path and a control electrode, the conduction paths of each being connected in parallel between said first operating voltage terminal and the amplifier output terminal; and
- a second pair of field effect transistors of a second conductivity type, each having a conduction path and a control electrode, the conduction paths of each being connected in parallel between the second node and the amplifier output terminal, the control electrodes of one transistor of each pair being connected to the amplifier input terminal and the control electrodes of the other transistor of each pair being connected to the amplifier output terminal.

7. In combination:

first and second nodes;

first and second complementary field effect transistor amplifiers, each having a first operating voltage terminal connected to said first node, a second operating voltage terminal connected to said second node, an input terminal and an output terminal;

a first variable impedance circuit coupled between said first node and a first reference voltage terminal and a second variable impedance circuit coupled between said second node and a second reference voltage terminal, each variable impedance circuit having a first control electrode coupled to the output terminal of the first amplifier and a second control electrode coupled to the output terminal of the second amplifier; and third and fourth complementary field effect transistor amplifiers, each having a first operating voltage terminal connected to said first node, a second operating voltage terminal connected to said second node, an input terminal and an output terminal, the input terminal of the third amplifier being connected to the output terminals of the first and fourth amplifiers, the input terminal of the fourth amplifier being connected to the output terminals of the second and third amplifiers, said third and fourth amplifiers each having a gain which is not greater than unity.

* * * * *